United States Patent
Leu et al.

(10) Patent No.: US 7,148,512 B2
(45) Date of Patent: *Dec. 12, 2006

(54) THERMAL INTERFACE WITH SILVER-FILLED CARBON NANOTUBES

(75) Inventors: Charles Leu, Fremont, CA (US); Tai-Cheng Yu, Tu-Cheng (TW); Ga-Lane Chen, Fremont, CA (US)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/021,923

(22) Filed: Dec. 23, 2004

(65) Prior Publication Data

US 2006/0118791 A1  Jun. 8, 2006

(30) Foreign Application Priority Data

Dec. 3, 2004 (TW) .............................. 93106646 A

(51) Int. Cl.
  *H01L 31/0312* (2006.01)
(52) U.S. Cl. .................... 257/77; 257/14; 428/332; 428/408; 427/430.1; 427/249.1
(58) Field of Classification Search .......... 257/14, 257/77; 428/332, 408, 336, 469; 427/430.1, 427/221, 248.1, 249.1
See application file for complete search history.

(56) References Cited

U.S. PATENT DOCUMENTS

| 6,350,488 B1 | 2/2002 | Lee et al. ............... 427/249.1 |
| 6,407,922 B1 | 6/2002 | Eckblad et al. ............ 361/704 |
| 2005/0136248 A1* | 6/2005 | Leu et al. .................. 428/332 |

OTHER PUBLICATIONS

Berber et al., "Unusually High Thermal Conductivity of Carbon Nanotubes," vol. 84, No. 20, *Physical Review Letters*, 2000, pp. 4613-4616.
Fan et al., "Self-Oriented Regular Arrays of Carbon Nanotubes and Their Field Emission Properties," vol. 283, *Science*, 1999, pp. 512-514.
Liu et al., "Isotope Labeling of Carbon Nanotubes and Formation of $^{12}C$—$^{13}C$ Nanotube Junctions," vol. 123, *J. Am. Chem. Soc.*, 2001, pp. 11502-11503.

* cited by examiner

*Primary Examiner*—Nathan J. Flynn
*Assistant Examiner*—Tan Tran
(74) *Attorney, Agent, or Firm*—Morris Manning & Martin; Tim Tingkang Xia, Esq.

(57) ABSTRACT

An exemplary thermal interface (40) includes a silver colloid base (32), and an array of carbon nanotubes (22) disposed in the silver colloid base uniformly. The carbon nanotubes have nanometer-scale silver filled therein, are substantially parallel to each other, and extend from a first surface (42) to a second surface (44) of the thermal interface.

20 Claims, 1 Drawing Sheet

THERMAL INTERFACE WITH SILVER-FILLED CARBON NANOTUBES

BACKGROUND OF THE INVENTION

1. Field of the Invention

The invention relates generally to thermal interfaces; and more particularly to a kind of thermal interface which conducts heat by using carbon nanotubes.

2. Description of Related Art

Electronic components such as semiconductor chips are becoming progressively smaller, while at the same time heat dissipation requirements thereof are increasing. Commonly, a thermal interface is utilized between the electronic component and a heat sink in order to efficiently dissipate heat generated by the electronic component.

A conventional thermal interface is made by diffusing particles with a high heat conduction coefficient in a base material. The particles can be made of graphite, boron nitride, silicon oxide, alumina, silver, or other metals. However, a heat conduction coefficient of the thermal interface is now considered to be too low for many contemporary applications, because it cannot adequately meet the heat dissipation requirements of modern electronic components.

A new kind of thermal interface has recently been developed. The thermal interface is obtained by fixing carbon fibers with a polymer. The carbon fibers are distributed directionally, and each carbon fiber can provide a heat conduction path. A heat conduction coefficient of this kind of thermal interface is relatively high. However, the heat conduction coefficient of the thermal interface is inversely proportional to a thickness thereof, and the thickness is required to be greater than 40 micrometers. In other words, the heat conduction coefficient is limited to a certain value corresponding to a thickness of 40 micrometers. The value of the heat conduction coefficient cannot be increased, because the thickness cannot be reduced.

U.S. Pat. No. 6,407,922 discloses another kind of thermal interface. The thermal interface is formed by injection molding, and has a plurality of carbon nanotubes incorporated in a matrix material. A first surface of the thermal interface engages with an electronic device, and a second surface of the thermal interface engages with a heat sink. The second surface has a larger area than the first surface, so that heat can be uniformly spread over the larger second surface.

However, the thermal interface formed by injection molding is relatively thick. This increases a bulk of the thermal interface and reduces its flexibility. Furthermore, the carbon nanotubes are disposed in the matrix material randomly and multidirectionally. This means that heat does not necessarily spread uniformly through the thermal interface. In addition, the heat does not necessarily spread directly from the first surface engaged with the electronic device to the second surface engaged with the heat sink.

A new thermal interface which overcomes the above-mentioned problems is desired.

BRIEF SUMMARY OF THE INVENTION

Accordingly, an object of the present invention is to provide a thermal interface having a reduced thickness, good flexibility and excellent heat conduction.

To achieve the above-mentioned object, the present invention provides a thermal interface comprising a silver colloid base and an array of carbon nanotubes embedded in the silver colloid base uniformly.

The silver colloid base comprises silver particles, boron nitride particles, and polysynthetic oils. The carbon nanotubes have nanometer-scale silver filled therein, are substantially parallel to each other, and extend from a first surface to a second surface of the thermal interface.

Unlike in a conventional thermal interface, the carbon nanotubes of the thermal interface of the present invention are disposed in the silver colloid base uniformly and directionally. Thus, each carbon nanotube of the thermal interface can provide a heat conduction path in a direction perpendicular to a main heat absorbing surface of the thermal interface. This ensures that the thermal interface has a high heat conduction coefficient.

Furthermore, the carbon nanotubes have nanometer-scale silver filled therein, and this further enhances the thermal conductivity and heat conduction stability.

Other objects, advantages and novel features of the invention will become more apparent from the following detailed description when taken in conjunction with the accompanying drawings, in which:

DESCRIPTION OF THE PREFERRED EMBODIMENT

Figure 1:
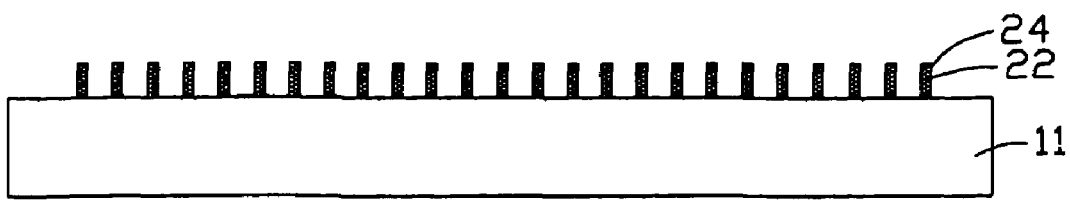
FIG. 1 is a schematic, side cross-sectional view of an array of carbon nanotubes directionally formed on a substrate, the carbon nanotubes having nanometer-scale silver filled therein.

Referring to FIG. 1, an array of carbon nanotubes 22 having nanometer-scale silver 24 filled therein is shown. The carbon nanotubes 22 are substantially parallel to each other and directionally formed on a substrate 11.

In a preferred method of the present invention, the carbon nanotubes 22 with the nanometer-scale silver 24 filled therein are manufactured as follows. Firstly, the substrate 11 is provided. The substrate 11 can be made of glass, quartz, silicon, or alumina. In the preferred method, the substrate 11 is made of porous silicon. A surface of the porous silicon is a porous layer. Diameters of apertures in the porous layer are extremely small, generally about 3 nanometers. Then a catalyst film (not shown) is uniformly deposited on the substrate 11 by thermal disposition, electron-beam disposition, or sputtering. The catalyst film 12 can be made of iron (Fe), cobalt (Co), nickel (Ni), or an alloy thereof. In the preferred method, the catalyst film 12 is made of iron.

Secondly, the catalyst film is oxidized to obtain catalyst particles. The substrate 11 with the catalyst particles disposed thereon is placed in a reaction furnace. A carbon source gas with nanometer-scale silver mixed therein is introduced into the reaction furnace at a temperature of 350–1000° C. to grow the array of carbon nanotubes 22 with the nanometer-scale silver 24 filled therein. The carbon source gas can be acetylene or ethene. A height of the array of carbon nanotubes 22 can be controlled by controlling the growth time thereof. The height of the array of carbon nanotubes 22 is generally in the range from 1 to 100 micrometers. In the preferred method of the present invention, the height of the array of carbon nanotubes 22 is about 100 micrometers. In the preferred method, the nanometer-scale silver 24 is nanometer-scale silver particles, and a purity thereof is about 99.9 percent. The nanometer-scale silver 24 is columnar, corresponding to the shapes of the carbon nanotubes 22.

Further details of the method for growing the array of carbon nanotubes 22 can be found in pages 512–514, Vol. 283, Science 1999, and in pages 11502–11503, Vol. 123, J. Am. Chem. Soc. 2001. Moreover, U.S. Pat. No. 6,350,488 discloses a method for mass synthesis of arrays of carbon nanotubes. These three publications are incorporated herein by reference.

In an alternative method, the carbon nanotubes 22 with the nanometer-scale silver 24 filled therein are manufactured by an arc discharge method. Firstly, a catalyst film (not shown) is uniformly deposited on the substrate 11, with a shape of the catalyst film being circular. Graphite poles with silver filled therein are provided as cathode electrodes and anode electrodes. Secondly, voltages are applied to the cathode electrodes and anode electrodes, thereby generating arc discharging. The anode electrodes are consumed, and the carbon nanotubes 22 with the nanometer-scale silver 24 filled therein are formed on the substrate 11.

In a further alternative method, the carbon nanotubes 22 with the nanometer-scale silver 24 filled therein are manufactured by a deposition method. Firstly, the array of carbon nanotubes 22 are directionally formed on the substrate 11 by thermal chemical vapor deposition or plasma enhanced chemical vapor deposition. Secondly, an opening is formed in a free end of each carbon nanotube 22 by a physical method or a chemical method, as known in the art. Thirdly, the nanometer-scale silver 24 is filled in the carbon nanotubes 22 via the openings, thereby providing the carbon nanotubes 22 with the nanometer-scale silver 24 filled therein formed on the substrate 11.

In the following description, the formed carbon nanotubes 22 with the nanometer-scale silver 24 filled therein will simply be referred to as "the carbon nanotubes 22."

Figure 2:
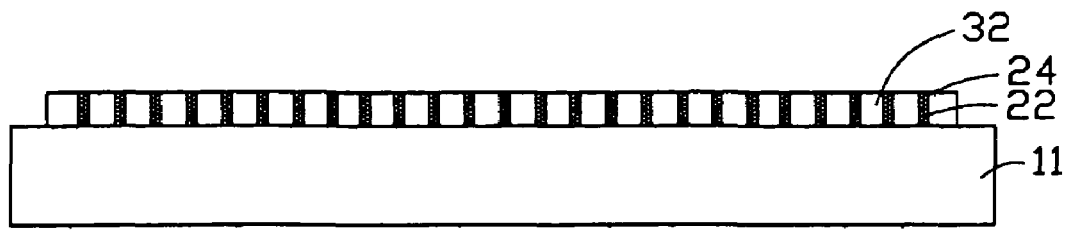
FIG. 2 is similar to FIG. 1, but showing the carbon nanotubes submerged in a silver colloid base.

FIG. 2 shows the carbon nanotubes 22 substantially submerged in a silver colloid base 32. The silver colloid base 32 comprises nanometer-scale silver particles, nanometer-scale boron nitride particles and polysynthetic oils, and has a high heat conduction coefficient and a low volatility. Diameters of the nanometer-scale silver particles are in the range from 1 to 900 nanometers. A purity of the nanometer-scale silver particles is about 99.9%. Diameters of the nanometer-scale boron nitride particles are in the range from 1 to 900 nanometers. The nanometer-scale boron nitride particles can ensure stable heat conduction. A viscosity of the silver colloid base 32 is required to be below 100 cps (centipoise).

Figure 3:
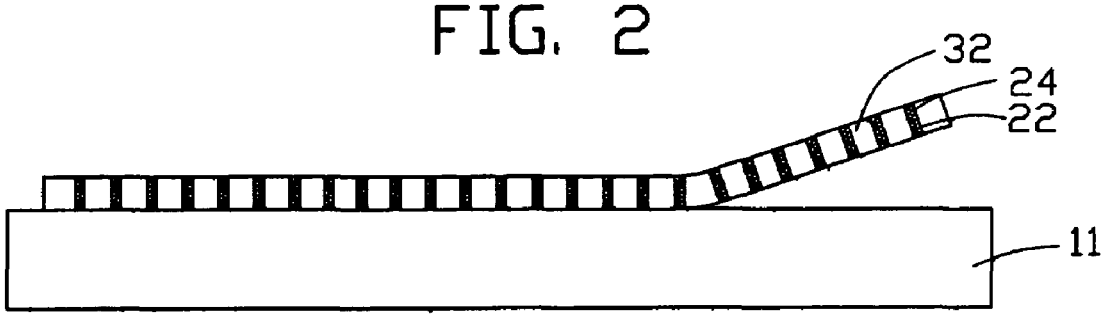
FIG. 3 is similar to FIG. 2, but showing the silver colloid base solidified with the carbon nanotubes embedded therein, and the silver colloid base being peeled off from the substrate.

Referring to FIG. 3, the silver colloid base 32 is cooled and solidified, and the solidified silver colloid base 32 with the carbon nanotubes 22 secured therein is peeled off from the substrate 11 to obtain a thermal interface 40. A thickness of the thermal interface 40 is preferably about 100 micrometers, being equal to the height of the carbon nanotubes 22. That is, the thickness of the thermal interface 40 is determined by the height of the carbon nanotubes 22. Thus, the thickness of the thermal interface 40 can be varied by controlling the height of the carbon nanotubes 22.

Figure 4:
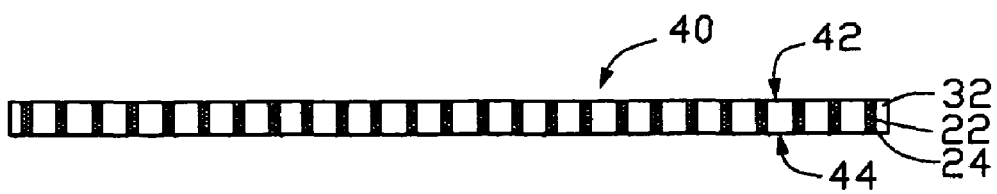
FIG. 4 is similar to FIG. 3, but only showing the thermal interface of the present invention, the thermal interface comprising the solidified silver colloid base and the carbon nanotubes disposed therein.

FIG. 4 shows the thermal interface 40 of the present invention in isolation. The thermal interface 40 comprises the silver colloid base 32, and the array of carbon nanotubes 22 embedded in the silver colloid base 32 uniformly. The thermal interface 40 has a first surface 42 to contact a thermally conductive body, and a second surface 44 opposite to the first surface 42 to contact a thermal source. Alternatively, the first surface 42 can contact a thermal source, and the second surface 44 can contact a thermally conductive body. The carbon nanotubes 22 are substantially parallel to each other, and extend from the first surface 42 to the second surface 44. In the preferred embodiment, the carbon nanotubes 22 are perpendicular to the first surface 42 and the second surface 44. Thus, each carbon nanotube 22 can provide a heat conduction path in a direction perpendicular to a selected main heat absorbing surface of the thermal interface 40. Therefore, the thermal interface 40 has a high heat conduction coefficient and can conduct heat uniformly. Furthermore, because the carbon nanotubes 22 have the nanometer-scale silver 24 filled therein, the thermal conductivity and heat conduction stability of the thermal interface 40 is further enhanced.

Figure 5:
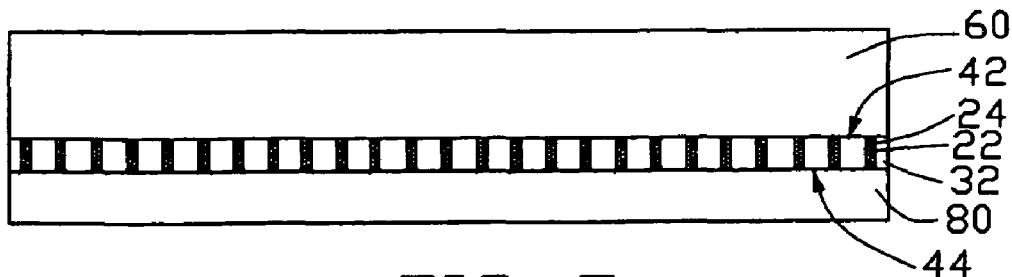
FIG. 5 is similar to FIG. 4, but showing the thermal interface sandwiched between an electronic device and a heat sink.

FIG. 5 shows an application of the thermal interface 40 of the present invention. The thermal interface 40 is sandwiched between a heat sink 60 and an electronic device 80 to provide good heat contact between the heat sink 60 and the electronic device 80. The first surface 42 of the thermal interface 40 engages with a surface (not labeled) of the heat sink 60, and the second surface 44 of the thermal interface 40 engages with a surface (not labeled) of the electronic device 80. Because the thickness of the thermal interface 40 is on a micron scale, the thermal interface 40 has good flexibility. Thus, even if the surface of the electronic device 80 is uneven, the thermal interface 40 can provide good heat contact between the heat sink 60 and the electronic device 80.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A thermal interface comprising:
   a silver colloid base; and
   a plurality of carbon nanotubes embedded in the silver colloid base;
   wherein the thermal interface has a first surface and a second surface opposite to the first surface; and
   the carbon nanotubes have nanometer-scale silver filled therein, are substantially parallel to each other, and extend from the first surface to the second surface.

2. The thermal interface as claimed in claim 1, wherein the carbon nanotubes are embedded in the silver colloid base uniformly.

3. The thermal interface as claimed in claim 2, wherein the carbon nanotubes are substantially perpendicular to the first and second surfaces.

4. The thermal interface as claimed in claim 1, wherein a thickness of the thermal interface is in the range from 1 to 100 micrometers.

5. The thermal interface as claimed in claim 1, wherein the nanometer-scale silver in each of the carbon nanotubes is columnar.

6. The thermal interface as claimed in claim 1, wherein a purity of the nanometer-scale silver is about 99.9 percent.

7. The thermal interface as claimed in claim 1, wherein the first and second surfaces are substantially parallel to each other.

8. The thermal interface as claimed in claim 1, wherein a viscosity of the silver colloid base is below 100 cps (centipoises).

9. The thermal interface as claimed in claim 1, wherein the silver colloid base comprises silver particles, boron nitride particles, and polysynthetic oils.

10. The thermal interface as claimed in claim 9, wherein diameters of the silver particles are in the range from 1 to 900 nanometers, a purity of the silver particles is about 99.9%, and diameters of the boron nitride particles are in the range from 1 to 900 nanometers.

11. A thermal interface having a first surface to thermally contact a first thermal source and a second surface to thermally contact a second thermal source, said thermal interface having a plurality of carbon nanotubes disposed therein and arranged to point essentially to a same direction between said first surface and said second surface, and each of said plurality of carbon nanotubes comprising nanometer-scale silver filled therein.

12. The thermal interface as claimed in claim 11, wherein said plurality of carbon nanotubes is embedded in a thermally conductive base including a silver colloid base to form said thermal interface.

13. A thermal interface having a first surface and a second surface opposite to the first surface, the thermal interface comprising a plurality of carbon nanotubes extending from the first surface to the second surface according to a predetermined direction, the carbon nanotubes each comprising nanometer-scale silver filled therein.

14. The thermal interface as claimed in claim 13, wherein said plurality of carbon nanotubes is embedded in a thermally conductive base including a silver colloid base to form said thermal interface.

15. The thermal interface as claimed in claim 14, wherein the carbon nanotubes are embedded in the silver colloid base uniformly.

16. The thermal interface as claimed in claim 13, wherein the carbon nanotubes are substantially perpendicular to the first and second surfaces.

17. The thermal interface as claimed in claim 13, wherein a thickness of the thermal interface is in the range from 1 to 100 micrometers.

18. The thermal interface as claimed in claim 13, wherein the nanometer-scale silver in each of the carbon nanotubes is columnar.

19. The thermal interface as claimed in claim 13, wherein the first and second surfaces are substantially parallel to each other.

20. The thermal interface as claimed in claim 13, wherein a viscosity of the silver colloid base is below 100 cps (centipoises).

\* \* \* \* \*